US006420779B1

(12) United States Patent
Sharma et al.

(10) Patent No.: US 6,420,779 B1
(45) Date of Patent: Jul. 16, 2002

(54) LEADFRAME BASED CHIP SCALE PACKAGE AND METHOD OF PRODUCING THE SAME

(75) Inventors: Nirmal K. Sharma, Fremont, CA (US); Rahamat Bidin; Hien Boon Tan, both of Singapore (SG)

(73) Assignee: ST Assembly Test Services Ltd., Singapore (SG)

( * ) Notice: Subject to any disclaimer, the term of this patent is extended or adjusted under 35 U.S.C. 154(b) by 0 days.

(21) Appl. No.: 09/395,923

(22) Filed: Sep. 14, 1999

(51) Int. Cl.[7] .............................................. H01L 23/495
(52) U.S. Cl. ....................... 257/666; 257/667; 257/669; 257/670; 257/676
(58) Field of Search ................... 257/666, 667, 257/669, 670, 671, 673, 676

(56) References Cited

U.S. PATENT DOCUMENTS

| | | | |
|---|---|---|---|
| 5,363,279 A | 11/1994 | Cha | 361/767 |
| 5,428,248 A | 6/1995 | Cha | 257/676 |
| 5,519,251 A | 5/1996 | Sato et al. | 257/666 |
| 5,656,550 A | 8/1997 | Tsuji et al. | 438/123 |
| 5,770,888 A | 6/1998 | Song et al. | 257/696 |
| 5,773,313 A | 6/1998 | Sato et al. | 437/216 |
| 5,866,939 A | 2/1999 | Shin et al. | 257/666 |
| 5,894,108 A | 4/1999 | Mostafazadeh et al. | 174/52.4 |
| 5,898,212 A | 4/1999 | Kim | 257/666 |
| 5,900,676 A | 5/1999 | Kweon et al. | 257/787 |
| 5,929,514 A | 7/1999 | Yalamanchili | 257/676 |
| 5,933,709 A | 8/1999 | Chun | 438/122 |
| 5,939,774 A | 8/1999 | Yamada | 257/666 |
| 5,942,794 A | 8/1999 | Okumura et al. | 257/666 |
| 6,041,495 A * | 3/2000 | Yoon et al. | 29/841 |
| 6,143,981 A * | 11/2000 | Glenn | 257/670 |
| 6,166,430 A * | 12/2000 | Yamaguchi | 257/666 |
| 6,177,718 B1 * | 1/2001 | Kozono | 257/666 |

FOREIGN PATENT DOCUMENTS

| | | | |
|---|---|---|---|
| JP | 2-63142 | | 3/1990 |
| JP | 411354572 | * | 12/1999 |

OTHER PUBLICATIONS

Konishi, S., et al., "QFN (Quad Flat Non–Leaded Package)," 4th Symposium on "Microjoining and Assembly Technology in Electronics," Japan Welding Society (Committee of Microjoining), Yokohama, Jan. 29–30, 1998, pp. 149–152 (in Japanese, with English translation).

* cited by examiner

*Primary Examiner*—Nathan Flynn
*Assistant Examiner*—Remmon R. Fordé
(74) *Attorney, Agent, or Firm*—Ronald S. Laurie; Constance F. Ramos; Skadden, Arps

(57) ABSTRACT

An embodiment of the invention in a quad flat no-lead package is described. The package is produced by encapsulating an integrated circuit chip, a die pad to which the chip is affixed, and leads which are connected to the chip in a molding compound. Leads are positioned on all four sides of the package, the exposed (bottom) portions of the leads are coplanar with the bottom of the package, and the leads do not extend, or extend only slightly, beyond the area of the package. The package includes a die pad also having an exposed (bottom) portion that is coplanar with the bottom of the package. The top portions of the leads are coplanar with the top surface of the die pad, and are flat.

8 Claims, 6 Drawing Sheets

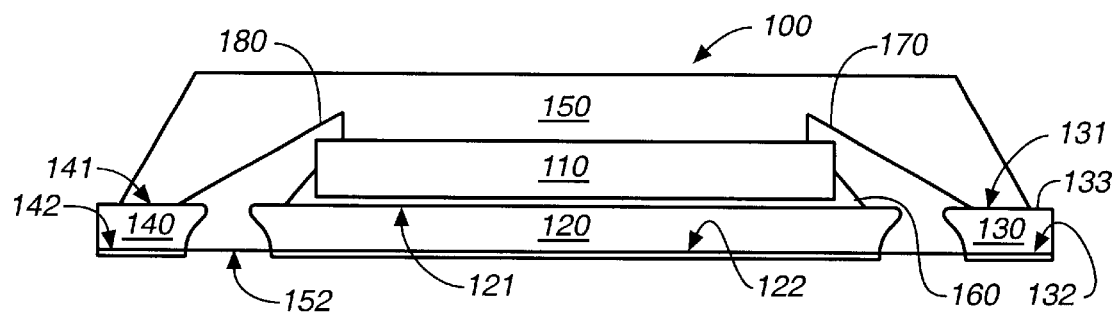
*FIG._1*
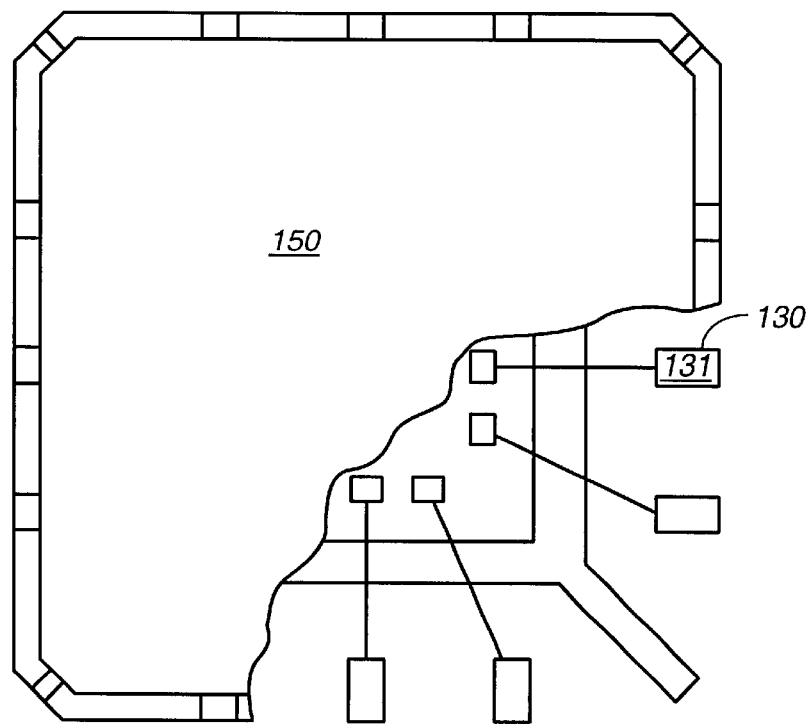
*FIG._2*

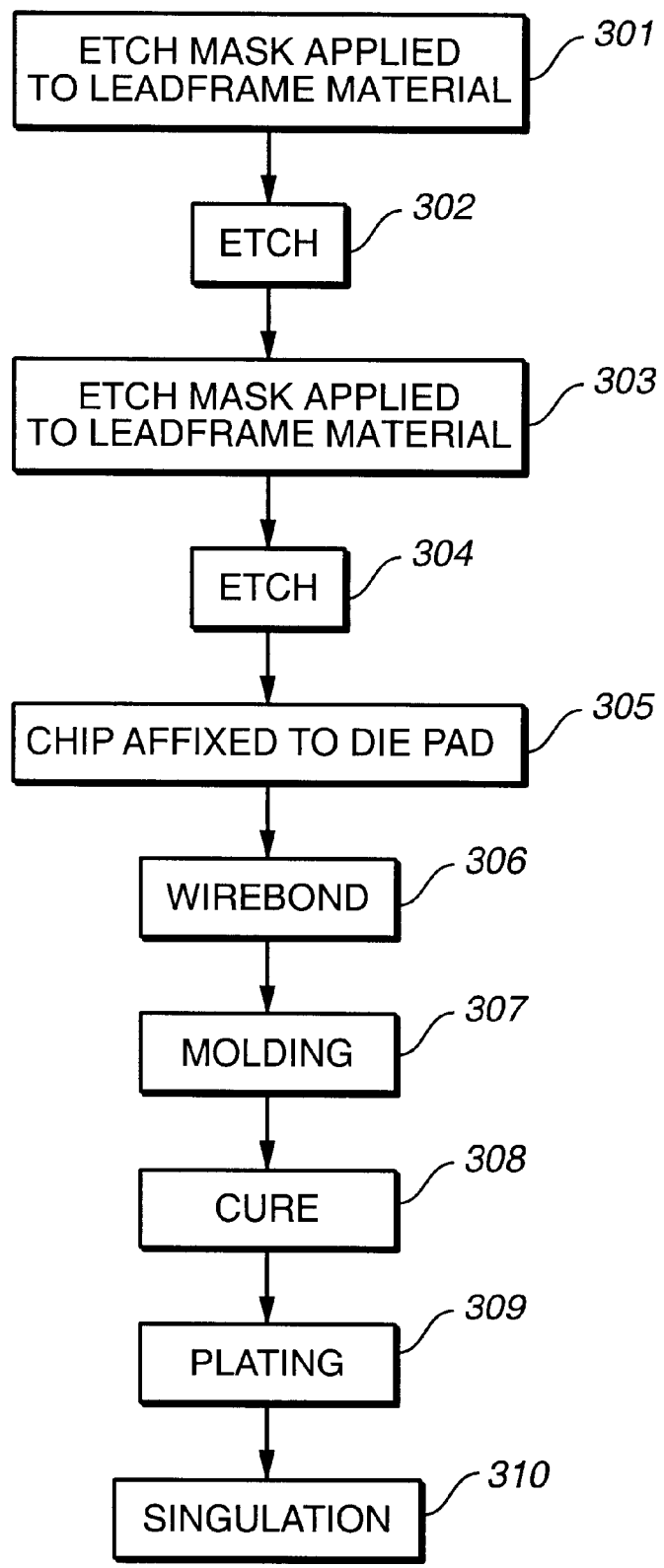
FIG._3

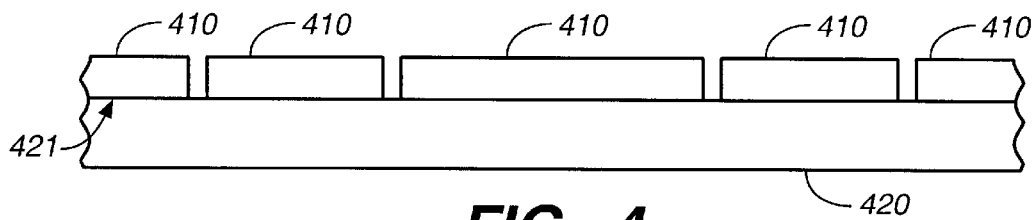
FIG._4
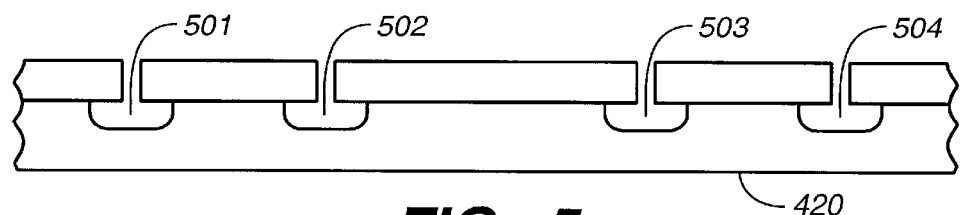
FIG._5
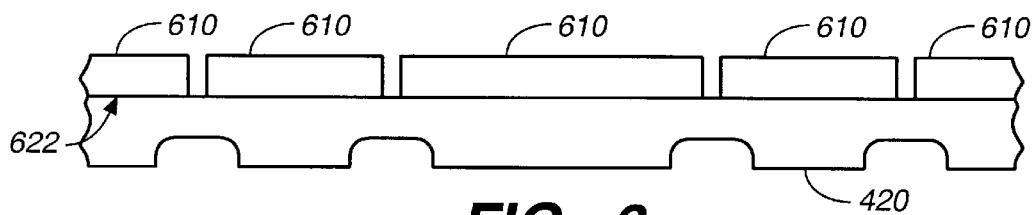
FIG._6
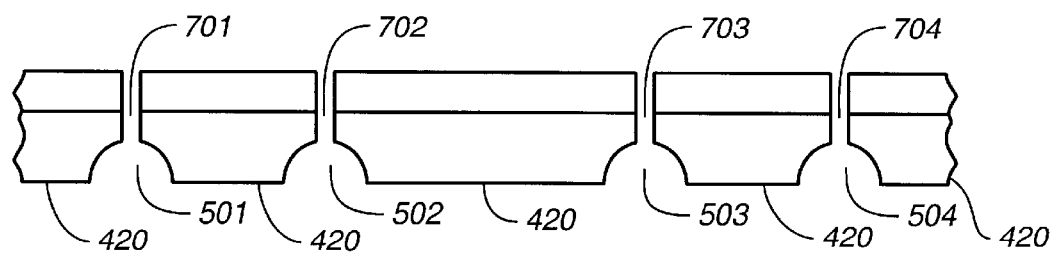
FIG._7

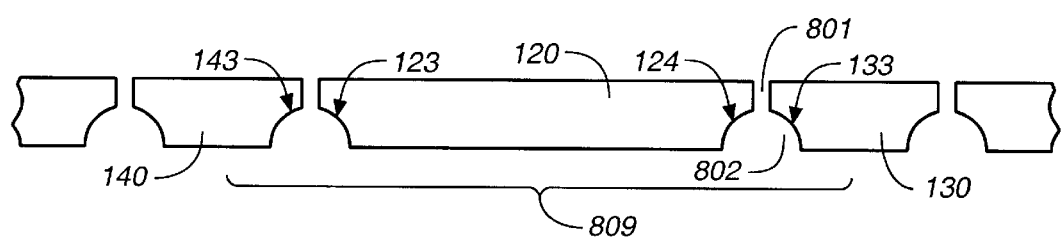
FIG._8
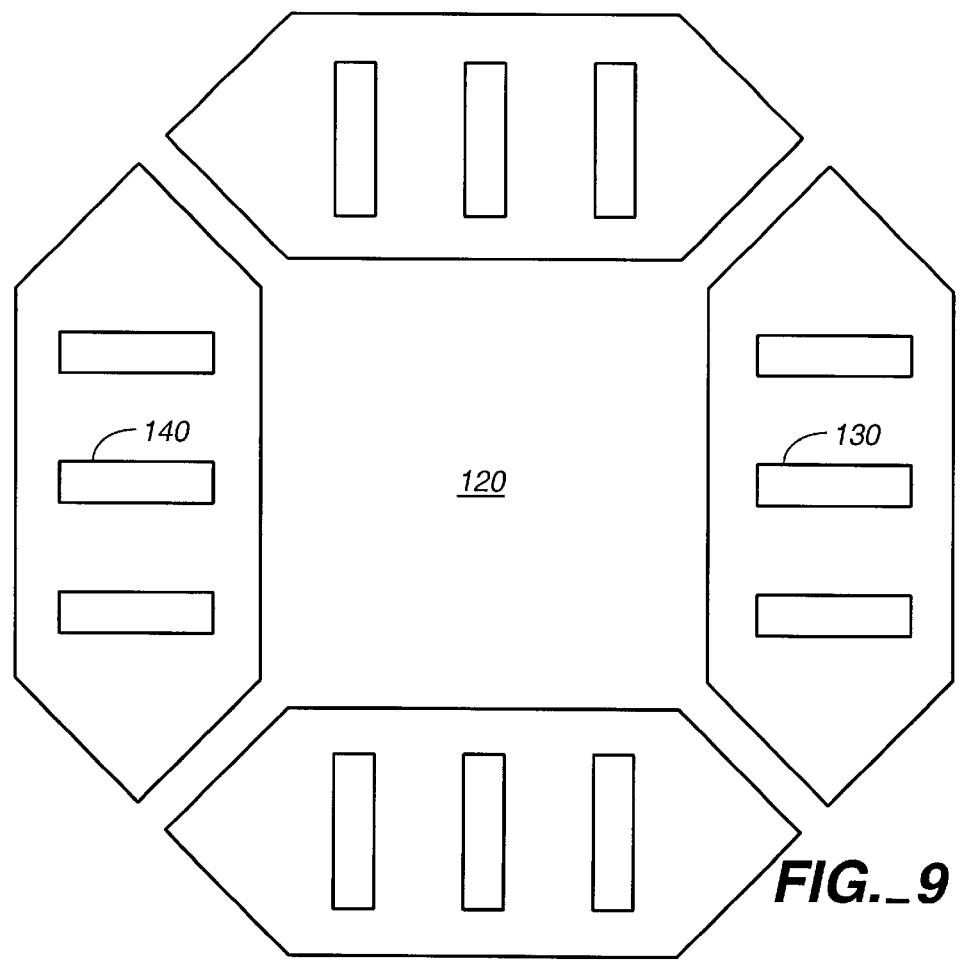
FIG._9

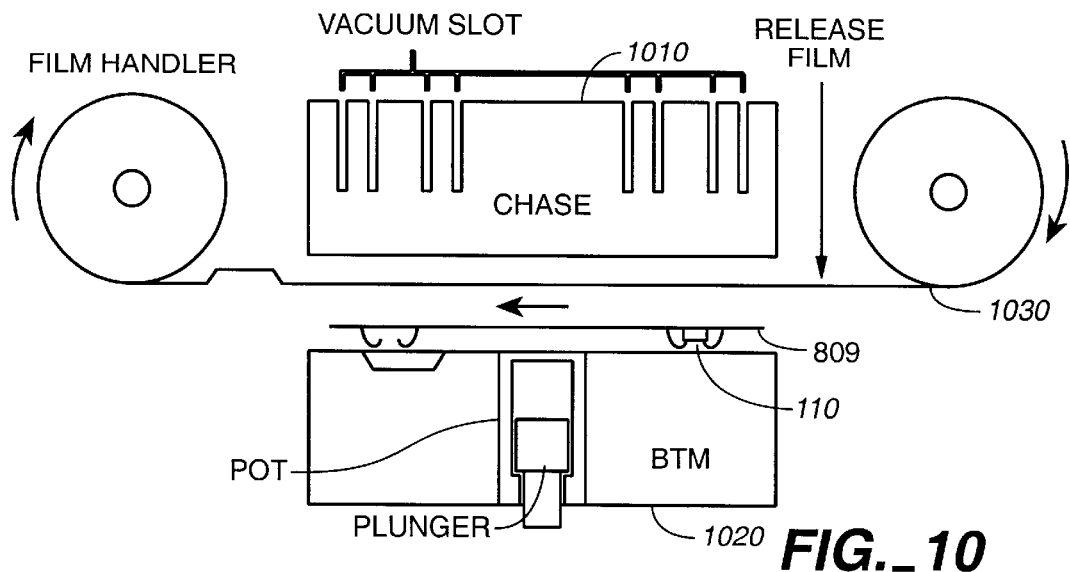
FIG._10
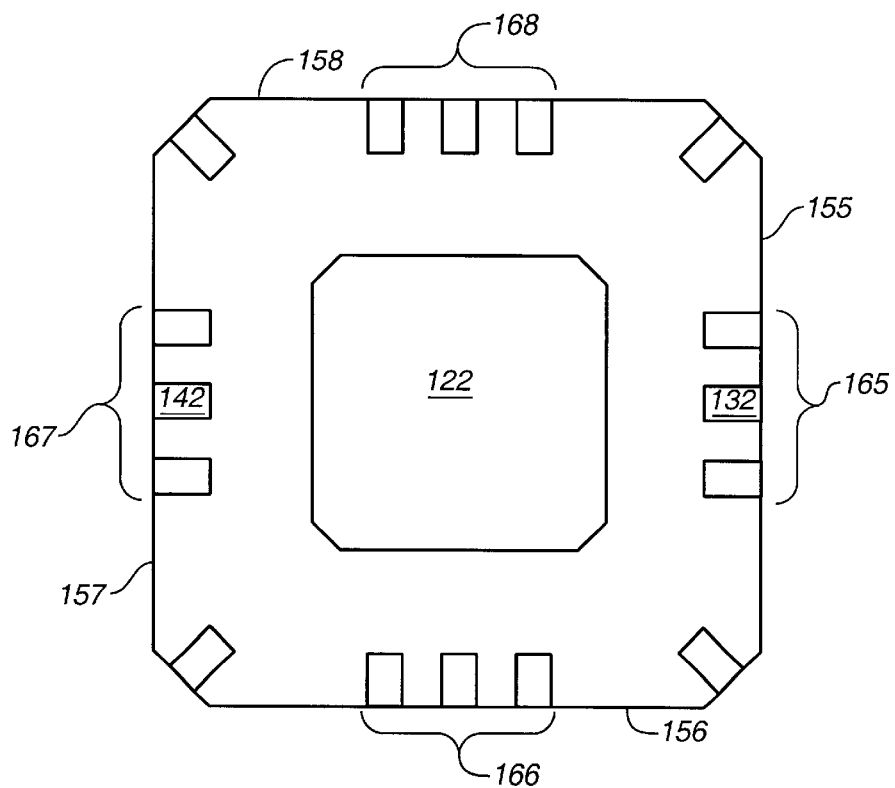
FIG._11

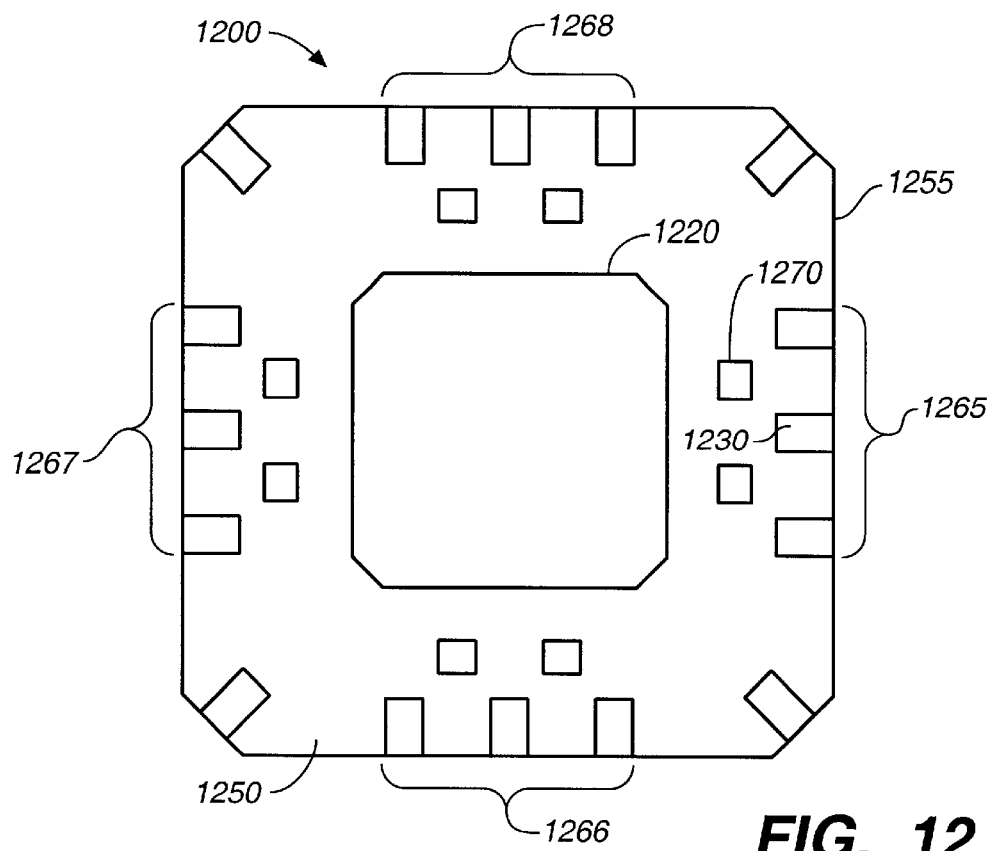
FIG._12
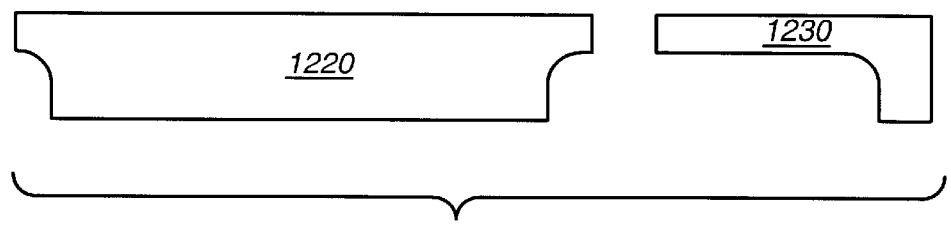
FIG._13
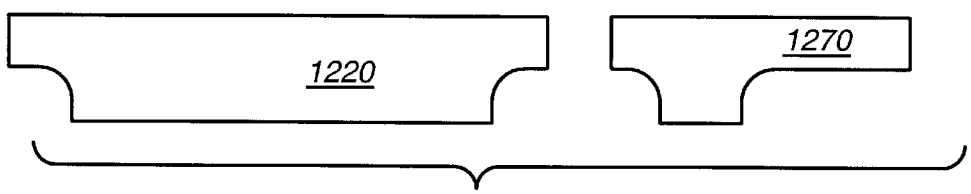
FIG._14

LEADFRAME BASED CHIP SCALE PACKAGE AND METHOD OF PRODUCING THE SAME

BACKGROUND OF THE INVENTION

1. Field of the Invention

The present invention relates to integrated circuit packaging, and more particularly to leadframe based chip scale packaging of integrated circuits.

2. Related Art

A desire to reduce the size of electronic devices has resulted in the a demand to increase the mounting density of integrated circuits (ICs) on printed circuit boards (PCBs). This demand has spurred the development of new technologies designed to reduce the difference between the PCB area required to mount an IC and the area of the IC chip itself. One such technology involves using a molded package where the leads do not extend, or extend only slightly beyond the area of the package.

A first approach to this technology is illustrated in FIG. 2 of U.S. Pat. No. 5,519,251 (hereafter '251), entitled "Semiconductor Device And Method Of Producing The Same" According to this approach, the length of the leads projecting outside the edges of the package is reduced by exposing a bottom surface of a portion of each lead at the bottom of the package. Another approach, offering a reduced package area, is described in the above mentioned U.S. Patent, as well as in U.S. Pat. No. 5,363,279 (hereafter '279) and 5,428,248 (hereafter '248), entitled "Semiconductor Package For A Semiconductor Chip Having Centrally Located Bottom Bond Pads" and "Resin Molded Semiconductor Package", respectively. This approach is known as "chip on lead" (COL), because the chip is positioned on top of an inner portion of the leads, so that the outer ends of the leads, and therefore the edges of the package, can be moved closer to the center of the die. One goal of this type of approach is the design of a "chip scale package" (CSP), so called because the area of the package is approximately the same as, or slightly larger than, the area of the chip.

There are a number of disadvantages to each of these prior approaches. In addition to having the disadvantage of a greater package area than the latter mentioned approaches, the first approach (FIG. 2 of '251) has the disadvantage that an efficient means for dissipating heat generated from the IC chip is lacking. This heat dissipation disadvantage is also shared by the approaches of '279 and '248. While the approach of '251 adds a stage or die pad to improve the heat dissipation efficiency, this approach requires the use of two lead frames, necessitating a more complex and expensive assembly process. Also, the approaches of '279 and '259 require that the bond pads to which the leads are electrically connected be positioned in the center of the die, rather than around the outside edge of the die. This requirement generally adds complexity and area to the layout of the die. Finally, all four of these approaches suffer from the disadvantage that the exposed portions of the leads are exposed by virtue of being coplanar with the bottom surface of the molding compound. Therefore, these approaches are susceptible to a manufacturing problem known as "mold flash", where during the molding process, some of the molding compound bleeds out over the portions of the leads intended to be completely exposed.

The mold flash problem can addressed by adding a process step to remove the mold flash. However, the addition of this step adds process complexity and does not always completely clear off the exposed portions of the leads, resulting in the potential for unreliable mechanical, electrical, and thermal connections between the leads and the PCB. Therefore, two other approaches have been developed. One of these is described in U.S. Pat. No. 5,656,550 (hereafter '550), entitled "Method Of Producing A Semiconductor Device Having A Lead Portion With Outer Connecting Terminal", and U.S. Pat. No. 5,900,676 (hereafter '676), entitled "Semiconductor Device Package Structure Having Column Leads And A Method For Production Thereof". According to each of these approaches, the leads are exposed through the bottom of the package, but the are not coplanar with the bottom of the package. Therefore, the mold flash problem can be reduced. However, both of these approaches require additional process steps to achieve this result.

In response to the aforementioned disadvantages of these prior approaches, a novel leadframe based CSP and its method of production have been developed.

SUMMARY OF THE INVENTION

A novel electronic device and its method of production are disclosed. The device includes an integrated circuit chip, a die pad, leads, and a molding compound. The chip is affixed to the top surface of the die pad. The leads are connected to the chip, and the top surface of each lead is flat. The molding compound encapsulates the chip, die pad, and leads such that the bottom surface of the die pad and the bottom surface of each lead is exposed and coplanar with the bottom surface of the molding compound.

BRIEF DESCRIPTION OF THE DRAWINGS

FIG. 1 is a cross sectional illustration of one embodiment of a device according to the invention.

FIG. 2 is a top down illustration of the device of FIG. 1, with a cutaway view of the interior.

FIG. 3 is a flow chart illustrating an embodiment of the invention in a method of producing the device of FIG. 1.

FIG. 4 is a cross sectional illustration of a leadframe material during a first masking step of a leadframe production method according to the invention.

FIG. 5 is a cross sectional illustration of a leadframe material during a first etching step of a leadframe production method according to the invention.

FIG. 6 is a cross sectional illustration of a leadframe material during a second masking step of a leadframe production method according to the invention.

FIG. 7 is a cross sectional illustration of a leadframe material during a second etching step of a leadframe production method according to the invention.

FIG. 8 is a cross sectional illustration of a leadframe produced by the leadframe production portion of the method of FIG. 3.

FIG. 9 is a top down illustration of the leadframe of FIG. 8.

FIG. 10 is an illustration of the use of film assisted molding equipment in an embodiment of the invention.

FIG. 11 is a bottom up illustration of the device of FIG. 1.

FIG. 12 is a bottom up illustration of another embodiment of a device according to the invention.

FIG. 13 is a cross sectional illustration of the device of FIG. 12.

FIG. 14 is a cross sectional illustration of the device of FIG. 12.

DETAILED DESCRIPTION

A novel leadframe based chip scale package and its method of production are described. In the following description, numerous specific details are set forth in order to provide a thorough understanding of the invention. However, these specific details are not necessary in order to practice the invention.

Embodiments of the invention will be described that take advantage of several of the benefits available to those practicing the invention. An embodiment to be described with reference to FIGS. 1 and 2 illustrates a quad flat no-lead (QFN) package, so called because the leads are positioned on all four sides of the package, the exposed (bottom) portions of the leads are coplanar the bottom of the package, and the leads do not extend, or extend only slightly, beyond the area of the package. The package includes a die pad also having an exposed (bottom) portion that is coplanar with the bottom of the package. The top portions of the leads are coplanar with the top surface of the die pad, and are flat.

Providing leads on all four sides of the package allows an improvement in the ratio between pincount and area. Exposing the leads at the bottom of the package allows a reduction in the board area required to mount the package on a PCB. Exposing the die pad at the bottom of the package allows the die pad to be soldered to the PCB to provide an improvement in thermal, electrical, and mechanical reliability. A reduction in the complexity of the lead frame manufacturing process and/or elimination of a post mold etching process are possible given the coplanarity of the bottom of the leads and die pad with the bottom of the package. The mold flash problem can be reduced by using film assisted molding equipment (FAME) during the molding process, as will be subsequently described. A reduction in the complexity of the wire bon d process through the elimination of downset bonding is possible given the coplanarity of the top of the leads with the top of the die pad. A half etch technique, also to be subsequently described, can be used for the lead frame manufacturing process to allow a reduction in package area.

Overall, the invention can be used to provide smaller, less expensive, more manufacturable, more reliable IC packages. Also, it is possible to practice the invention with few changes to an existing assembly infrastructure, and with a short learning curve.

FIG. 1 is a cross sectional illustration of one embodiment of a device according to the invention. Device 100 includes integrated circuit chip 110, die pad 120, leads 130 and 140, and molding compound 150. Chip 110 is affixed to die pad 120 with epoxy 160. Lead 130 is electrically connected to chip 110 through bond wire 170, and lead 140 is electrically connected to chip 110 through bond wire 180.

FIG. 2 is a top down illustration of device 100, with a cutaway view of the interior. The portion of lead 130 that is visible from a top down perspective when molding compound 150 is cut away is top surface 131 of lead 130. Referring back to FIG. 1, the top surface 131 of lead 130 is flat, i.e., there are no bends or steps in top surface 131. The portion of lead 130 that is approximately parallel to top surface 131 and furthest from top surface 131 is bottom surface 132. The portion of die pad 120 that is coplanar with bottom surface 132 of lead 130 is bottom surface 122 of die pad 120. Top surface 141 and bottom surface 142 of lead 140 are also shown in FIG. 1.

Molding compound 150 encapsulates chip 110, die pad 120, and leads 130 and 140 such that bottom surface 122 of die pad 120, bottom surface 132 of lead 130, and bottom surface 142 of lead 140 are coplanar with bottom surface 152 of molding compound 150. Therefore, bottom surfaces 122, 132, and 142 of die pad 120, lead 130, and lead 140, respectively, are exposed such that they can be electrically connected to a printed circuit board.

FIG. 3 is a flow chart illustrating an embodiment of the invention in a method of producing the IC device of FIG. 1. In steps 301 through 305, a leadframe is prepared according to a novel "half etch" technique.

Step 301 is described with reference to FIG. 4. In step 301, etch mask 410 is applied to side 421 of leadframe material 420. Leadframe material 420 can be any electrically conductive material such as but not limited to copper or a copper alloy. Etch mask 410 can be any of a variety of materials known in the art of leadframe etching, and can be patterned according to any of a variety of known techniques such as photolithography.

Step 302 is described with reference to FIG. 5. In step 302, leadframe material 420 is etched according to any of a variety of known techniques. The etching process proceeds isotropically and is stopped after the depths of etched areas 501, 502, 503, and 504 are approximately half of the thickness of leadframe material 420.

Step 303 is described with reference to FIG. 6. In step 303, etch mask 610 is applied to side 622 of leadframe material 420. Step 304 is described with reference to FIG. 7. In step 304, leadframe material 420 is etched so that areas 701, 702, 703, and 704 contact areas 501, 502, 503, and 504.

Steps 301 through 304 produce leadframe 809 as illustrated in the cross sectional view of FIG. 8 and the top down perspective view of FIG. 9. Leadframe 809 includes die pad 120 and leads 130 and 140. The half etch process results in a profile of sidewalls 123, 124, 133, and 143 that includes a relatively straight portion above a relatively concave portion. Thus, top gap 801 between lead 130 and die pad 120 is smaller than bottom gap 802 between lead 130 and die pad 120. Benefits of this result will be described below.

Returning to FIG. 3, and referring to FIG. 1, in steps 305 through 310, leadframe 809 is used in the production of device 100. In step 305, chip 110 is affixed to die pad 120 with epoxy 160. Epoxy 160 can be conductive or nonconductive within the scope of the present invention.

In step 306, leads 130 and 140 are wirebonded to chip 110 according to any of a variety of well known wire bonding techniques. Since top surface 121 of die pad 120 is coplanar with top surfaces 131 and 141 of leads 130 and 140, respectively, the wirebonding process does not require special tooling such as is needed for downset bonding.

In step 307, chip 110 and leadframe 809 are encapsulated in molding compound 150, such as plastic resin, according to any of a variety of molding processes. In one embodiment, step 307 is performed using film assisted molding equipment (FAME) so as to address the mold flash problem. FAME technology is illustrated in FIG. 10. Chip 110 and leadframe 809 are encapsulated between top chase 1010 and bottom chase 1020. Film 1030 is positioned between leadframe 809 and top chase 1010 during molding. Film 1030 provides a soft cushion to create a tight seal between leadframe 809 and top chase 1010 to reduce the potential for bleeding of molding compound 150 between die pad 120 and leads 130 and 140.

In step 308, molding compound 150 is cured.

In step 309, the exposed portions of leadframe 809 are plated with a conductive material such as silver solder or palladium to protect the leadframe from corrosion and to facilitate mounting of device 100 to a PCB. Step 309 can be performed according to a conventional plating process or a photomechanical plating process, the latter of which provides superior plating tolerance and less bleeding between leads.

In step 310, singulation is performed by dicing device 100 away from adjacent device formed using leadframe 809. Step 310 can be performed according to a variety of known techniques, which can depend on the specific molding technique used in step 307. For example, pocket molding, wherein each chip is encapsulated in a separate molded body can be used in step 307, in which case a singulation punch can be used in step 310 to cut the leadframe between adjacent molded bodies. One advantage of this pocket molding technique is that a portion of the upper surface of the leads, e.g. portion 133 of lead 130 in FIG. 1, is exposed for electrical probing even after mounting. Alternatively, block molding, wherein a strip or array of chips is encapsulated within a single molded body, in which case a dicing blade can be used to the body and leadframe between chips. Advantages of this block molding technique include a potential increase in strip or array density and greater flexibility in package body sizes.

Thus, device 100 has been produced according to the method illustrated in FIG. 3. Referring to device 100 in FIG. 1, benefits of the half etch process discussed above can be described.

One benefit is that the minimum distance between the top surfaces of the die pad and leads is not limited to the minimum distance between the corresponding bottom surfaces as required to guard against bridging during the surface mount process. Therefore, since the maximum area of the chip is limited by the area of the top surface of the die pad, a larger chip can fit into a package having the same area as a package that is not produced in accordance with the invention. In other words, for a chip having a given area, a potential for a decreased package area exists. Also, the lengths of the wire bonds between the chip and the leads can be reduced, resulting in the potential for improved electrical performance and reliability.

Another benefit is that the die frame and leads are "locked" into molding compound 150 by virtue of their increasing area, parallel to bottom surface 152 of molding compound 150, from bottom surface 152 upwards. Therefore, leads are less likely to be pulled out through the bottom of the package during singulation or otherwise. Similarly, mechanical solder joint reliability is improved.

FIG. 11 is a bottom up perspective view of device 100, showing exposed bottom surfaces 122, 132, and 142 of die pad 120, lead 130, and lead 140, respectively. Molding compound 150 has four sides, side 155, 156, 157, and 158. Leads are are arranged into four groups, groups 165, 166, 167, and 168, where group 165 corresponds to side 155, group 166 corresponds to side 156, group 167 corresponds to side 157, and group 168 corresponds to side 158, each by virtue of its location on the bottom surface 152 of molding compound 150. More specifically, in this embodiment, leads are arranged into four rows, where each row is parallel to and located approximately alongside a different side of molding compound 150.

FIG. 12 is a bottom up perspective view of another embodiment of the invention. Device 1200 includes die pad 1220, and four groups of leads, groups 1265, 1266, 1267, and 1268. The leads are grouped according to the location of their exposed bottom surfaces. For example, the exposed bottom surfaces of the leads of group 1265 are arranged into two rows, each row being parallel to and approximately alongside side 1255 of molding compound 1250.

FIGS. 13 and 14 are cross sectional view of device 1200. FIG. 13 is a cross section through die pad 1220 and lead 1230, and FIG. 14 is a cross section through die pad 1220 and lead 1270. The cross sectional shapes of die pad 1220 and leads 1230 and 1270 have been formed using the half etch process of leadframe production described above. Here, the first etch step, corresponding to step 302 in FIG. 3, is performed using a mask having areas defining the bottom surfaces of die pad 1220 and leads 1230 and 1270. Therefore, leads having a greater length than those shown in FIG. 1 can be formed, while maintaining the coplanarity of the top surfaces of the die pad and the leads and the coplanarity of the bottom surfaces of the die pad and the leads.

In the foregoing specification, the invention has been described with reference to specific examplary embodiments thereof. However, various modifications can be made to these embodiments, and various other embodiments are possible within the scope of the invention. For example, different arrangements of leads are possible than those shown in FIGS. 2 and 12. For another example, additional steps, such as a deflash step or a marking step, can be added to the method illustrated in FIG. 3. The specification and figures are, accordingly, to be regarded in an illustrative sense, while the invention is set forth in the following claims.

What is claimed is:

1. An electronic device comprising:
   a die pad having a top surface and a bottom surface;
   an integrated circuit chip affixed to said top surface of said die pad;
   a plurality of leads, each having a flat top surface and a bottom surface, each of said leads being connected to said chip, wherein said top surface of each of said plurality of leads is coplanar with said top surface of said die pad, and wherein each of said plurality of leads has at least one sidewall having a relatively straight portion above a relatively concave portion; and
   a molding compound having a bottom surface and encapsulating said die pad, said chip, and said plurality of leads such that said bottom surface of said die pad and each of said bottom surfaces of said plurality of leads are exposed and coplanar with said bottom surface of said molding compound.

2. The electronic device of claim 1 wherein said die pad has at least one sidewall having a relatively straight portion above a relatively concave portion.

3. The electronic device of claim 1 wherein the bottom surfaces of said plurality of leads are devoid of said molding compound.

4. The electronic device of claim 3 wherein said bottom surface of said die pad is devoid of said molding compound.

5. A chip scale package for an integrated circuit comprising:
   four sides;
   a die pad having a top surface, a bottom surface smaller than said top surface, and a sidewall having a relatively straight portion above a relatively concave portion;
   an integrated circuit chip affixed to said top surface of said die pad;
   a plurality of leads, each having a flat top surface coplanar with said top surface of said die pad, a bottom surface smaller than said top surface, and a sidewall having a relatively straight portion above a relatively concave portion, each of said lead s being connected to said chip, said plurality of leads arranged into four groups, each of said groups corresponding to one of said four sides of said package; and a molding compound having a bottom surface and encapsulating said die pad, said chip, and said plurality of leads such that said bottom surface of said die pad and each of said bottom surfaces of said plurality of leads are exposed and coplanar with said bottom surface of said molding compound.

6. An electronic device comprising:

a die pad having a top surface and a bottom surface;

an integrated circuit chip affixed to said top surface of said die pad;

a plurality of leads, each having a flat top surface and a bottom surface, each of said leads being connected to said chip; and a molding compound having a bottom surface and encapsulating said die pad, said chip, and said plurality of leads such that said bottom surface of said die pad and each of said bottom surfaces of said plurality of leads are exposed and coplanar with said bottom surface of said molding compound, wherein said molding compound has four sides and said plurality of leads is arranged into four groups, each of said four groups corresponding to one of said four sides of said molding compound, and wherein each of said four groups of leads includes at least two subgroups, such that for each of said four groups, the lower surfaces of the leads in a first subgroup form a first row and the lower surfaces of the leads in a second subgroup form a second row.

7. An electronic device comprising:

a die pad having a top surface and a bottom surface;

an integrated circuit chip affixed to said top surface of said die pad;

a plurality of leads, each having a flat top surface and a bottom surface, each of said leads being connected to said chip;

a plating material on the bottom surfaces of each of said plurality of leads, wherein the side surfaces of said plurality of leads are devoid of said plating material; and a molding compound having a bottom surface and encapsulating said die pad, said chip, and said plurality of leads such that said bottom surface of said die pad and each of said bottom surfaces of said plurality of leads are exposed and coplanar with said bottom surface of said molding compound.

8. The electronic device of claim 1, 6, or 7, wherein said top surface of said die pad is larger than said bottom surface of said die pad.

* * * * *